(12) United States Patent
Ohashi et al.

(10) Patent No.: US 10,998,161 B2
(45) Date of Patent: May 4, 2021

(54) ANODE, AND X-RAY GENERATING TUBE, X-RAY GENERATING APPARATUS, AND RADIOGRAPHY SYSTEM USING THE SAME

(71) Applicant: CANON KABUSHIKI KAISHA, Tokyo (JP)

(72) Inventors: Yasuo Ohashi, Hadano (JP); Kazuyuki Ueda, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 440 days.

(21) Appl. No.: 15/312,948

(22) PCT Filed: Jul. 13, 2015

(86) PCT No.: PCT/JP2015/003518
§ 371 (c)(1),
(2) Date: Nov. 21, 2016

(87) PCT Pub. No.: WO2016/009633
PCT Pub. Date: Jan. 21, 2016

(65) Prior Publication Data
US 2017/0213686 A1    Jul. 27, 2017

(30) Foreign Application Priority Data

Jul. 18, 2014  (JP) .............................. JP2014-147338
Jul. 3, 2015  (JP) .............................. JP2015-134263

(51) Int. Cl.
*H01J 35/12*    (2006.01)
*H05G 1/02*    (2006.01)
(Continued)

(52) U.S. Cl.
CPC ............ *H01J 35/186* (2019.05); *G01N 23/04* (2013.01); *H01J 35/02* (2013.01); *H01J 35/08* (2013.01);
(Continued)

(58) Field of Classification Search
CPC .... A61B 6/00; A61B 6/40; A61B 6/44; A61B 2560/00; A61B 2560/04;
(Continued)

(56) References Cited

U.S. PATENT DOCUMENTS 7,180,981 B2  2/2007 Wang
7,526,069 B2  4/2009 Matsumura et al.
(Continued)

FOREIGN PATENT DOCUMENTS

CN    103943442 A    7/2014
CN    104701118 A    6/2015
(Continued)

OTHER PUBLICATIONS

Office Action dated Dec. 20, 2018, in counterpart application TW106114826 (14 pages).
(Continued)

*Primary Examiner* — Anastasia Midkiff
(74) *Attorney, Agent, or Firm* — Venable LLP

(57) ABSTRACT

A thickness of a bonding material (8) is varied in a radial direction orthogonal to a central axis (P) of the tubular anode member (6), the bonding material (8) being used for bonding a transmitting substrate (7) for supporting a target layer (9) and a tubular anode member (6) in a direction along the central axis (P). Thus, a region in which a circumferential tensile stress of the bonding material (8) is alleviated is formed in the direction along the central axis (P) to prevent a crack from developing in the bonding material (8).

31 Claims, 6 Drawing Sheets

(51) Int. Cl.
*H01J 35/02* (2006.01)
*H01J 35/32* (2006.01)
*H01J 35/16* (2006.01)
*H01J 35/08* (2006.01)
*H01J 35/18* (2006.01)
*H01J 1/94* (2006.01)
*H01J 37/02* (2006.01)
*G01N 23/04* (2018.01)

(52) U.S. Cl.
CPC ............ *H01J 35/12* (2013.01); *H01J 35/165* (2013.01); *H01J 35/32* (2013.01); *H05G 1/025* (2013.01); *G01N 2223/308* (2013.01); *H01J 1/94* (2013.01); *H01J 35/116* (2019.05); *H01J 37/023* (2013.01); *H01J 2235/08* (2013.01); *H01J 2235/083* (2013.01); *H01J 2235/085* (2013.01); *H01J 2235/086* (2013.01); *H01J 2237/032* (2013.01); *H01J 2237/036* (2013.01); *H05G 1/02* (2013.01)

(58) Field of Classification Search
CPC .... A61B 2560/0406; A61B 2560/0418; H05G 1/00; H05G 1/02; H05G 1/025; H05G 1/04; H05G 1/08; H05G 1/26; H05G 1/30; H05G 1/36; H05G 1/52; G01N 2223/00; G01N 2223/308; H01J 1/00; H01J 1/02; H01J 1/36; H01J 1/38; H01J 1/42; H01J 1/88; H01J 1/90; H01J 1/92; H01J 1/94; H01J 1/96; H01J 33/00; H01J 33/02; H01J 33/04; H01J 35/00; H01J 35/02; H01J 35/025; H01J 35/04; H01J 35/08; H01J 35/12; H01J 35/16; H01J 35/165; H01J 35/186; H01J 35/32; H01J 37/00; H01J 37/02; H01J 37/023; H01J 37/04; H01J 37/16; H01J 37/165; H01J 2235/00; H01J 2235/08; H01J 2235/081; H01J 2235/083–088; H01J 2235/18; H01J 2235/186; H01J 2237/00; H01J 2237/02; H01J 2237/026; H01J 2237/03; H01J 2237/032; H01J 2237/036; H01J 2237/038; H01J 2237/06; H01J 2237/061
See application file for complete search history.

(56) References Cited

U.S. PATENT DOCUMENTS

| | | | |
|---|---|---|---|
| 8,406,378 | B2 | 3/2013 | Wang et al. |
| 9,251,995 | B2 | 2/2016 | Ogura et al. |
| 9,502,204 | B2 | 11/2016 | Ikarashi et al. |
| 10,020,158 | B2 | 7/2018 | Yamada et al. |
| 10,032,597 | B2* | 7/2018 | Ohashi ............... H01J 35/08 |
| 2006/0280290 | A1 | 12/2006 | Matsumura et al. |
| 2010/0260324 | A1 | 10/2010 | Legall et al. |
| 2011/0255664 | A1 | 10/2011 | Ueda et al. |
| 2012/0051496 | A1 | 3/2012 | Wang et al. |
| 2013/0016812 | A1 | 1/2013 | Yanagisawa et al. |
| 2014/0140480 | A1 | 5/2014 | Ogura et al. |
| 2014/0192957 | A1 | 7/2014 | Tamura et al. |
| 2014/0203183 | A1* | 7/2014 | Sando ................ H01J 35/08 250/393 |
| 2014/0205071 | A1* | 7/2014 | Ikarashi ............. H01J 35/08 378/111 |
| 2014/0254754 | A1 | 9/2014 | Ikarashi et al. |
| 2015/0162161 | A1 | 6/2015 | Yamada et al. |
| 2016/0020060 | A1 | 1/2016 | Ohashi et al. |

FOREIGN PATENT DOCUMENTS

| | | |
|---|---|---|
| EP | 2 757 570 A2 | 7/2014 |
| EP | 2757570 A2 | 7/2014 |
| EP | 2887380 A1 | 6/2015 |
| JP | 2013-51153 A | 3/2013 |
| JP | 2 887 380 A1 | 6/2015 |
| KR | 10-2014-0093630 A | 7/2014 |
| RU | 2195739 C2 | 12/2002 |
| TW | 200518154 A | 6/2005 |
| TW | 200849307 A | 12/2008 |
| WO | 2012/077463 A1 | 6/2012 |
| WO | 2013/031423 A1 | 3/2013 |
| WO | 2013/032014 A1 | 3/2013 |

OTHER PUBLICATIONS

Extended European Search Report dated Nov. 27, 2018, in counterpart application EP 18187557.6 (6 pages).
Taiwanese Office Action dated Dec. 20, 2016, issued in counterpart TW application 104123255 (7 pages).
Office Action dated Oct. 17, 2017 in counterpart CN application No. 201580038166.5—13 pages.
Office Action dated Apr. 2, 2018, in Russian counterpart application 2017105143 (14 pages).
Office action dated May 30, 2019, in counterpart application in 201747004680 (5 pages).
Office Action dated Apr. 9, 2019, in counterpart application JP 2015-134263 (6 pages).
Office Action dated Aug. 27, 2019, in counterpart application CN 201810786935.5 (13 pages).
Office Action dated May 13, 2020, in Malaysian counterpart application PI2017700144 (4 pages).

* cited by examiner

ANODE, AND X-RAY GENERATING TUBE, X-RAY GENERATING APPARATUS, AND RADIOGRAPHY SYSTEM USING THE SAME

This application claims the benefit of Japanese Patent Application No. 2014-147338, filed Jul. 18, 2014 and Japanese Patent Application No. 2015-134263, filed Jul. 3, 2015, which are hereby incorporated by reference herein in their entirety.

TECHNICAL FIELD

The present invention relates to an anode to be used in an X-ray generating tube and including a transmission target, and also relates to an X-ray generating tube including the anode, an X-ray generating apparatus including the X-ray generating tube, and a Radiography system including the X-ray generating apparatus.

BACKGROUND ART

A transmission type X-ray generating tube including a transmission target is known. The transmission target uses an X-ray emitted from a side thereof, which is opposite to a side on which an electron beam bombards the target. The transmission type X-ray generating tube may include a target as an end window of the X-ray generating tube. Such a transmission type X-ray generating tube has advantageous features in that a radiation angle can become wider, heat dissipation performance can become higher, and an X-ray generating apparatus can be downsized. The target in such a transmission type X-ray generating tube is hermetically bonded to a tubular anode member via a bonding material such as a silver brazing material formed on a periphery of the target.

CITATION LIST

Patent Literature

PTL 1: Japanese Patent Application Laid-Open No. 2013-51153

In Patent Literature 1, there is disclosed a transmission type X-ray generating tube including a tubular anode member having an opening diameter with a distribution and a transmission target held by the tubular anode member.

In such an X-ray generating tube including the transmission target as an end window, when X-ray generating operation is repeated, a desired tube current sometimes cannot be obtained and hence it is difficult to secure a necessary X-ray output. A transmission type X-ray generating tube that can obtain a stable X-ray output has been required.

SUMMARY OF INVENTION

Technical Problem

However, in an X-ray generating tube, generally, X-ray emitting operation and stoppage thereof are repeated. In this cycle of operation-stoppage of the X-ray generating tube, a difference in heat shrinkage amount between a transmitting substrate and a bonding material is caused. Therefore, a circumferential tensile stress acts on the bonding material in contact with the transmitting substrate along a circumference thereof. There are cases where a crack develops in the bonding material, and vacuum leakage is caused in the X-ray generating tube when the tensile stress exceeds a tensile strength of the bonding material.

It is an object of the present invention to inhibit, in an anode including a transmission target and a tubular anode member that are bonded together via a bonding material, occurrence of vacuum leakage accompanying a cycle of operation-stoppage of an X-ray generating tube. It is another object of the present invention to provide an X-ray generating tube that includes the highly reliable anode and that can obtain a stable X-ray output, and to provide an X-ray generating apparatus and a Radiography system that are highly reliable.

Solution to Problem

According to a first aspect of the present invention, there is provided an anode, including:
a transmission target including:
a target layer for generating an X-ray through irradiation of an electron beam; and
a transmitting substrate for supporting the target layer and for transmitting the X-ray generated by the target layer; and
a tubular anode member for supporting the transmitting substrate at a tube inner circumference thereof,
in which a side surface of the transmitting substrate and the tube inner circumference of the tubular anode member are bonded together by a bonding material, and
in which the bonding material has a thickness that varies in a direction along a tube axis of the tubular anode member.

According to a second aspect of the present invention, there is provided an X-ray generating tube, including:
a tubular insulating tube;
a cathode mounted on one end of the insulating tube;
an anode mounted on another end of the insulating tube; and
an electron emission source arranged in the insulating tube and connected to the cathode,
the anode being the anode of the first aspect of the present invention.

According to a third aspect of the present invention, there is provided an X-ray generating apparatus, including:
the X-ray generating tube of the second aspect of the present invention; and
a drive circuit for applying a tube voltage to the cathode and the anode of the X-ray generating tube.

According to a fourth aspect of the present invention, there is provided a Radiography system, including:
the X-ray generating apparatus of the third aspect of the present invention;
an X-ray detection device for detecting an X-ray that is emitted from the X-ray generating apparatus and passes through a subject; and a system control device for integrally controlling the X-ray generating apparatus and the X-ray detection device.

Advantageous Effects of Invention

In the anode according to the present invention, the bonding material that bonds the transmitting substrate of the target and the tubular anode member has the region in which the compression stress in the circumferential direction caused in the cycle of operation-stoppage of the X-ray generating tube is alleviated, and development of a crack is inhibited. Therefore, in the X-ray generating tube using the anode, occurrence of vacuum leakage due to driving for emitting the X-ray is inhibited, and a highly reliable X-ray generating tube is provided. Further, the highly reliable X-ray generating apparatus and the highly reliable Radiography system are provided, each of which uses the X-ray generating tube.

Further features of the present invention will become apparent from the following description of exemplary embodiments with reference to the attached drawings.

DESCRIPTION OF EMBODIMENTS

Embodiments of the present invention are described in the following with reference to the drawings, but the present invention is not limited to those embodiments. Note that, well-known or publicly known technologies in the art are to be applied to parts that are not specifically illustrated or described herein.

<X-ray Generating Tube>

Figure 1A:
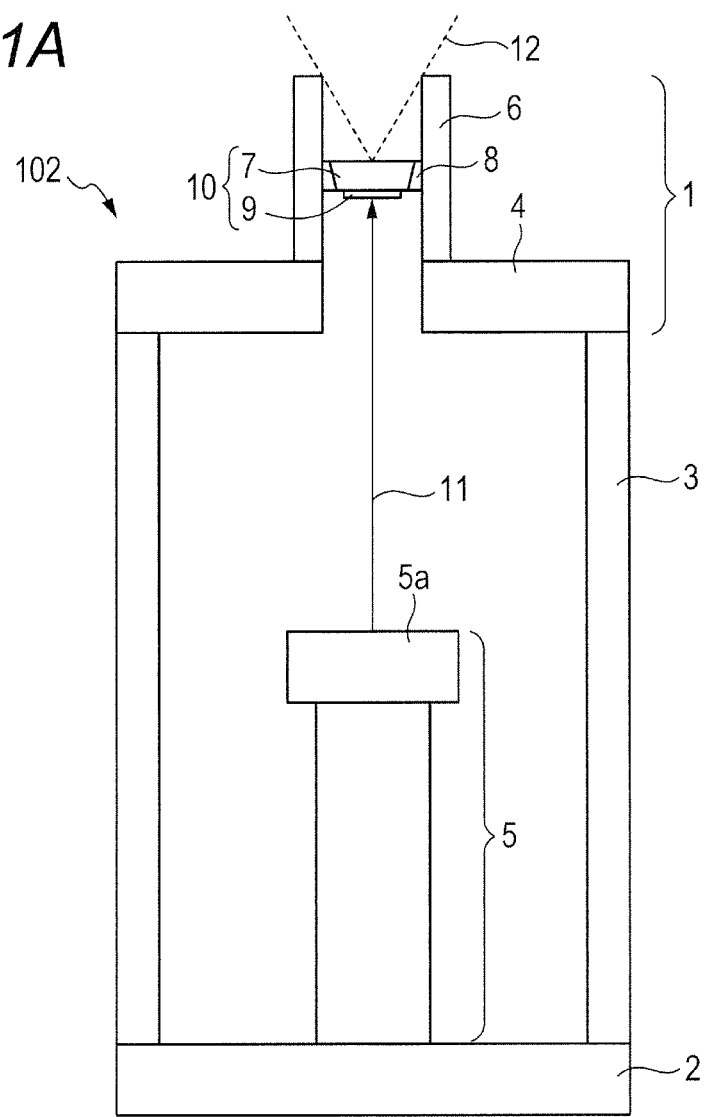
FIG. 1A is a sectional view for schematically illustrating a structure of an X-ray generating tube according to an embodiment of the present invention.

FIG. 1A is a view for schematically illustrating a structure of an X-ray generating tube according to an embodiment of the present invention. As illustrated in FIG. 1A, an X-ray generating tube 102 of the present invention includes a tubular insulating tube 3, a cathode 2 mounted on one end of the insulating tube 3, an anode 1 mounted on another end thereof, and an electron emission source 5 arranged in the insulating tube and connected to the cathode 2.

The electron emission source 5 includes an electron emitting source 5a. The anode 1 includes a target 10 at a location opposed to the electron emitting source 5a. According to the present invention, the target 10 is a transmission target including a target layer 9 for generating an X-ray through irradiation of an incident electron beam 11 and a transmitting substrate 7 for transmitting the X-ray generated at the target layer 9. The anode 1 further includes a tubular anode member 6 that is tubular and supports the transmitting substrate 7 of the target 10 on a tube inner circumference thereof. In this case, the tubular anode member 6 is mounted to the another end of the insulating tube 3 via an anode plate 4. The tubular anode member 6 and the transmitting substrate 7 are bonded to each other via a bonding material 8.

In the structure, when a tube voltage is applied between the cathode 2 and the anode 1, the electron beam 11 is emitted from the electron emitting source 5a and the electron beam 11 enters the target layer 9 to generate an X-ray 12.

Note that, electrons contained in the electron beam 11 are accelerated to have incident energy necessary for generating the X-ray 12 by an electric field between the electron emission source 5 and the target 10. The accelerating electric field is formed in a fully enclosed space in the X-ray generating tube 102 by defining the electron emission source 5 at a cathode potential and defining the target 10 at an anode potential by a tube voltage Va that is output from a drive circuit described below.

A trunk of the X-ray generating tube 102 according to the present invention is formed by the insulating tube 3 that is formed for electrical insulation purposes between the electron emission source 5 defined at a cathode potential and the target 10 defined at the anode potential. The insulating tube 3 is formed of an insulating material such as a glass material or a ceramic material. The insulating tube 3 can also have the function of defining a distance between the electron emission source 5 and the target layer 9.

The space in the X-ray generating tube 102 is depressurized so that the electron emission source 5 functions. It is preferred that the inside of the X-ray generating tube 102 have a vacuum of $10^{-8}$ Pa to $10^{-4}$ Pa, and, from the viewpoint of the life of the electron emission source 5, it is further preferred that the vacuum be $10^{-8}$ Pa to $10^{-6}$ Pa. It is preferred that, as a vacuum container, the X-ray generating tube 102 have hermeticity for maintaining such a vacuum and a durability against atmospheric pressure. The inside of the X-ray generating tube 102 can be depressurized by, after a vacuum is produced using a vacuum pump (not shown) via a discharge pipe (not shown), sealing the discharge pipe. Further, for the purpose of maintaining the vacuum degree, a getter (not shown) may be arranged in the X-ray generating tube 102.

The electron emission source 5 is arranged so as to be opposed to the target layer 9 of the target 10. As the electron emission source 5, for example, a tungsten filament, a hot cathode such as an impregnated cathode, or a cold cathode such as a carbon nanotube can be used. For the purpose of controlling a beam diameter, an electron current density, and the on/off position of the electron beam 11, the electron emission source 5 can include a grid electrode and an electrostatic lens electrode (not shown).

<Anode>

Figure 1B:
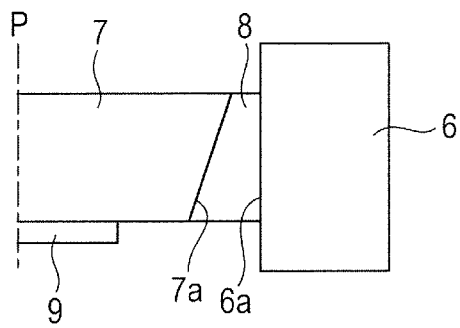
FIG. 1B is a partial enlarged sectional view of an anode of the X-ray generating tube illustrated in FIG. 1A.

FIG. 1B is a partial enlarged sectional view of the anode 1 illustrated in FIG. 1A. The anode 1 is an anode according to an embodiment of the present invention. In the anode according to the present invention, the target 10 is supported by bonding the tube inner circumference of the tubular anode member 6 as a supporting member of the target 10 to a side surface of the transmitting substrate 7 included in the target 10 via the bonding material 8.

The target 10 according to the present invention is a transmission target including the transmitting substrate 7 and the target layer 9. The target layer 9 is formed by appropriately selecting a material contained in the target layer and a thickness thereof together with a tube voltage Va, so as to serve as an X-ray generation source for emitting a necessary kind of ray. As a material of the target layer, for example, a metal material having an atomic number of 40 or more such as molybdenum, tantalum, tungsten, by way of example, can be contained. The target layer 9 can be formed on the transmitting substrate 7 by an arbitrary film forming method such as vapor deposition or sputtering.

The transmitting substrate 7 is formed of a material that transmits an X-ray to a high degree and is highly refractory such as beryllium, natural diamond, or artificial diamond. Of those, the artificial diamond formed by a high-temperature, high-pressure synthesis method or chemical vapor deposition is preferred from the viewpoint of for example, heat dissipation, reproducibility, uniformity, and cost. The transmitting substrate 7 not only acts as a transmission window for taking an X-ray generated at the target layer 9 out of the X-ray generating tube 102, but also acts as a member forming a vacuum container together with other members.

It is preferred that the transmitting substrate 7 be in the shape of a disk having a diameter of 2 mm to 10 mm. On the transmitting substrate 7, the target layer 9 is formed, on which a necessary focus diameter can be formed. Further, in the case where the transmitting substrate 7 is in the shape of a rectangular parallelepiped, the range of the diameter described above may be replaced with a length of a shorter side and a length of a longer side of a surface of the rectangular parallelepiped. Further, it is more preferred that a thickness of the transmitting substrate 7 be 0.3 mm to 4.0 mm. With this, durability against atmospheric pressure is maintained, and still, transmittance of the X-ray 12 can be secured.

The tubular anode member 6 not only has the function of defining an anode potential of the target layer 9 but also has the function of supporting the target 10. The tubular anode member 6 is electrically connected to the target 10 via an electrode (not shown). Further, the tubular anode member 6 and the transmitting substrate 7 of the target 10 are bonded together via the bonding material 8.

The components are bonded together via the bonding material 8 being, for example, a brazing material of various kinds such as a silver brazing material, a gold brazing material, or a copper brazing material, solder, by way of example. Among them, a silver brazing material is preferred, which enables the brazing at a relatively low brazing temperature that is high enough to prevent remelting even if the vacuum container is fired at high temperature.

Further, the tubular anode member 6 can have the function of blocking an X-ray by being formed of a material having a high specific gravity. From the viewpoint of downsizing the tubular anode member 6, it is preferred that a material forming the tubular anode member 6 have a mass attenuation coefficient $\mu/\rho$ [m$^2$/kg] and a density [kg/m$^3$] so that a product thereof is large, i.e., sufficient to downsize the tubular anode member 6. Further, from the viewpoint of further downsizing, it is preferred that a metallic element having specific absorption edge energy be appropriately selected as a material forming the tubular anode member 6, based on the kind of the X-ray 12 generated from the target layer 9. The tubular anode member 6 can be formed by one or at least two kinds of alloys of copper, silver, molybdenum, tantalum, tungsten, by way of example, and can contain the same metallic element as a target metal contained in the target layer 9.

The tubular anode member 6 is in a tubular shape surrounding the target layer 9, and thus functions as a forward shielding member that defines a range of an emission angle of the X-ray 12 emitted from the target layer 9. It is preferred that the tubular anode member 6 be cylindrical. Further, the tubular anode member 6 functions as a rear block that limits a range in which reflected and backscattered electrons (not shown) or a backscattered X-ray (not shown) reach from the target layer 9 toward the electron emission source 5.

First Embodiment

An anode 1 according to a first embodiment of the present invention is described. This case is a case in which the tubular anode member 6 is cylindrical and the transmitting substrate 7 of the target 10 is in the shape of a disk that is a concentric circle with the inner circumference of the tubular anode member 6 in plan view. As illustrated in FIG. 1B, in the anode of the present invention, the bonding material 8 has a thickness that varies in a direction along a central axis P of the tubular anode member 6 (hereinafter referred to as "central axis P"). Note that, in the present invention, the thickness of the bonding material 8 is a width of the bonding material 8 in a direction orthogonal to the central axis P of the tubular anode member 6, that is, in this case, a width of the bonding material 8 in a radial direction of the tubular anode member 6, and, a width of the drawing sheet of FIG. 1B in a lateral direction. Note that, the bonding material 8 has the uniform thickness in a circumferential direction with the central axis P being a center.

Further, the tubular anode member 6 is bonded to the transmitting substrate 7 via the ring-shaped bonding material 8. The bonding material 8 extends along a tube axis Q of the tubular anode member 6 so as to surround the tube axis Q. A mechanism of action of the present invention resides in that a tensile stress caused along the ring-shaped bonding material 8 surrounding the tube axis Q is alleviated by locally forming a compressive stress component along the tube axis Q.

The central axis P of the tubular anode member 6 herein can also be said to be a part of the tube axis Q of the tubular anode member 6. Therefore, only the central axis P of the tubular anode member 6 is illustrated, and illustration of the tube axis Q of the tubular anode member 6 is omitted.

In the present invention, in order to vary the thickness of the bonding material 8, one of a side surface 7a of the transmitting substrate 7 and an inner circumferential surface 6a of the tubular anode member 6 each of which serves as a bonding surface is slanted with respect to the central axis P. FIG. 1B is an illustration of a case in which the side surface 7a of the transmitting substrate 7 is slanted, and the thickness of the bonding material 8 reduces along the central axis P in a direction from the target layer 9 toward the transmitting substrate 7. Further, FIG. 1B is an illustration of a mode in which a cross-sectional area of the transmitting substrate 7 in the direction orthogonal to the central axis P increases along the central axis P in the direction from the target layer 9 toward the transmitting substrate 7.

In the present invention, by forming a thickness distribution of the bonding material 8 in the direction along the central axis P, development of a crack in the bonding material 8 caused when the transmitting substrate 7 and the tubular anode member 6 are bonded together or when an X-ray is emitted is inhibited. A mechanism of this action is described with reference to FIG. 2A to FIG. 2C, FIG. 3A, and FIG. 3B.

Figure 2A:
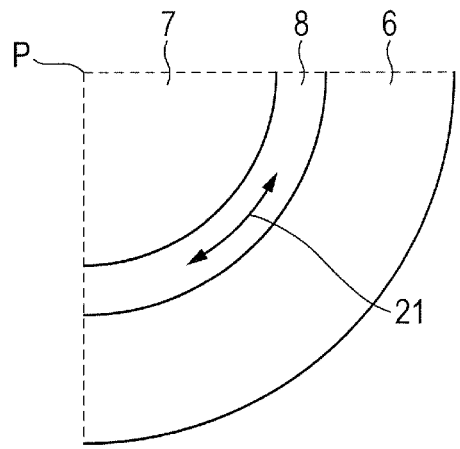
FIG. 2A is a partial plan view for illustrating a compression stress caused in a bonding material in the anode according to the embodiment of the present invention.
Figure 2B:
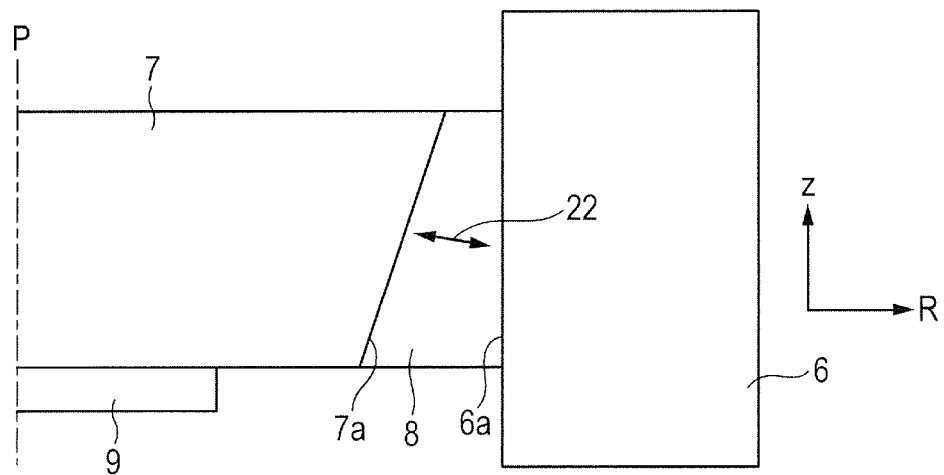
FIG. 2B is a partial sectional view along a central axis of a tubular anode member in the anode according to the embodiment of the present invention, and is an enlarged view of FIG. 1B.
Figure 2C:
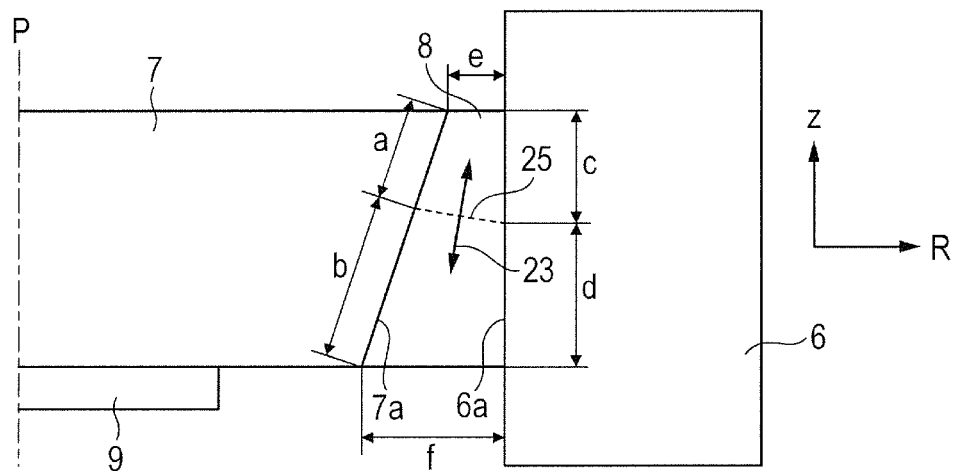
FIG. 2C is a partial sectional view taken along the central axis of the tubular anode member in the anode according to the embodiment of the present invention, and is an enlarged view of FIG. 1B.

FIG. 2A to FIG. 2C are schematic views for illustrating a tensile stress caused in the bonding material 8 when the bonding material 8 at a high temperature is cooled. FIG. 2A is a partial plan view when FIG. 1B is seen from the above of the drawing sheet, and FIG. 2B and FIG. 2C are enlarged views of FIG. 1A. With reference to FIG. 2A to FIG. 2C, a z direction is a direction along the central axis P, a θ direction is a circumferential direction annularly surrounding the central axis P being the center, and an R direction is a radial direction radially extending from the central axis P.

As illustrated in FIG. 2A, when a temperature of the hot bonding material 8 drops, because coefficients of thermal expansion of the transmitting substrate 7 and of the bonding material 8 have a relationship "transmitting substrate 7<bonding material 8", a difference therebetween causes a tensile stress 21 in the θ direction to act on the bonding material 8. It is assumed that the tensile stress 21 acts on an entire circumference of the bonding material 8, which causes a crack developed in the bonding material 8.

As illustrated in FIG. 2B, also with regard to the R direction, a tensile stress 22 acts on the bonding material 8, and distortion occurs in the bonding material 8. The transmitting substrate 7 and the tubular anode member 6 have coefficients of thermal expansion that are smaller than that of the bonding material 8, and thus, the bonding material 8 cannot contract in the R direction. Accordingly, the tensile stress 22 cannot be reduced.

Figure 3A:
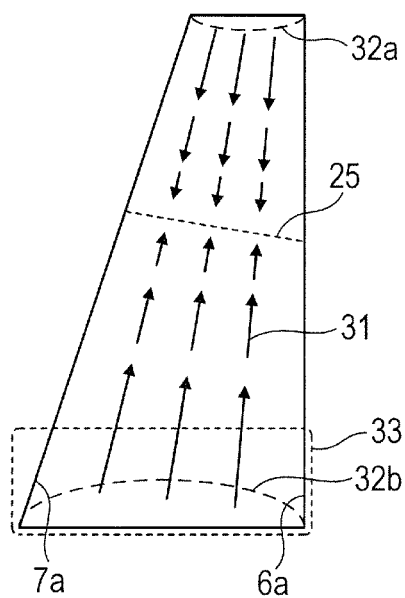
FIG. 3A is a sectional view of the bonding material for illustrating magnitude of distortion in the bonding material of the anode according to the present invention, and is a sectional view taken along the central axis of the tubular anode member.

Further, as illustrated in FIG. 2C, a tensile stress 23 acts also in the z direction. However, both ends of the bonding material 8 in the z direction are open and are not tied to the transmitting substrate 7 and the tubular anode member 6, and thus, the bonding material 8 can contract in the z direction. As illustrated in FIG. 3A, the bonding material 8 is contracted with a plane 25 being a return plane, on which distortion 31 is zero. As a distance from the plane 25 increases, the distortion 31 becomes larger. Therefore, as denoted by 32a and 32b in FIG. 3A, each of the ends of the bonding contracted material 8 in the z direction is a curved surface that is drawn inward.

The contraction of the bonding material 8 in the z direction alleviates the tensile stress in the θ direction in accordance with a Poisson's ratio. A stress σ is expressed by a product of a Young's modulus E (Pa) and a distortion factor ε of the bonding material 8, that is, σ=Eε. Thus, an alleviated amount of the stress σ is larger at both the ends of the bonding material 8 in the z direction at which the distortion is larger. See FIG. 3A. In this case, according to the present invention, the bonding material 8 has the thickness distribution in the z direction, and thus, the amount of the stress σ alleviated by the contraction in the z direction varies.

Figure 3B:
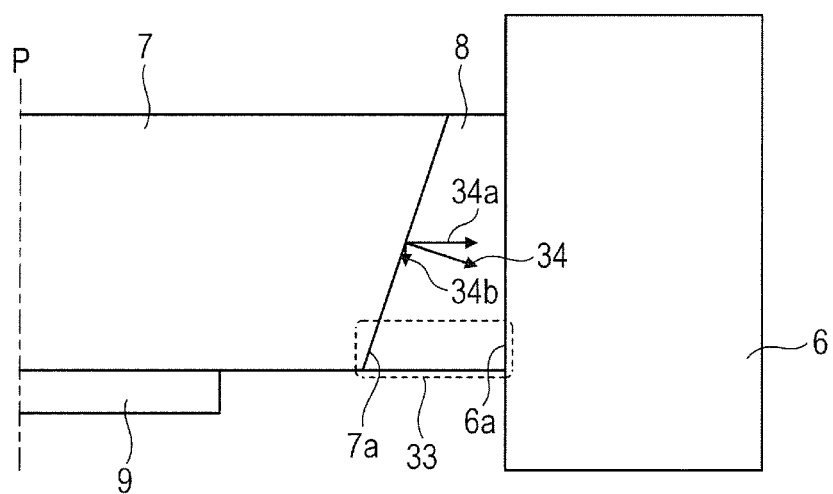
FIG. 3B is a sectional view for illustrating an alleviation region of the compression stress caused in the bonding material, and is a sectional view taken along the central axis of the tubular anode member.

The plane 25 on which the distortion in the z direction is zero is determined by a length of a bonded region in which the bonding material 8 is tied to the side surface 7a of the transmitting substrate 7 and the inner circumferential surface 6a of the tubular anode member 6, and by a length of an open region in which the bonding material 8 is not tied. Specifically, on a virtual plane including the central axis P illustrated in FIG. 2C, the plane 25 on which the distortion is zero is a plane on which a difference between the length of the bonded region and the length of the open region on one side of the plane 25 is the same as a difference between the length of the bonded region and the length of the open region on another side of the plane 25. In the case illustrated in FIG. 2C, a+c−e=b+d−f and a/b=c/d. Therefore, according to the present invention, the distortion becomes larger on a larger thickness side of the bonding material 8 and the compressive stress σ caused by the contraction becomes larger accordingly, to thereby alleviate the tensile stress in the θ direction more. With reference to FIG. 3A and FIG. 3B, a region 33 surrounded by the broken lines is a region in which the tensile stress in the θ direction is more alleviated.

Specifically, for the purpose of alleviating the circumferential tensile stress 21 of the bonding material 8, the bonding material 8 has a sectional shape so as to cause a compressive stress component in at least one of directions along the tube axis of the tubular anode member 6 (for example, a sectional shape having an area different from those of other sections).

Note that, in the direction along the tube axis of the tubular anode member 6, both end faces of the bonding material 8 of this embodiment are not in contact with another member, are covered with a thin plate having a small rigidity, or are in contact with another member having a coefficient of thermal expansion that is larger than that of the bonding material 8.

In the present invention, by forming, in the z direction, the region in the bonding material 8, in which the tensile stress in the θ direction is alleviated to an extent, development of a crack in the region of the bonding material 8 can be inhibited.

Further, as illustrated in FIG. 3B, in this case, the side surface 7a of the transmitting substrate 7 as the bonding surface is slanted, and thus, a force indicated by an arrow 34 along a direction of the normal to the side surface 7a acts on the side surface 7a due to the force of the bonding material 8 to contract. The force can be divided into a direction indicated by an arrow 34a along the R direction and a direction indicated by an arrow 34b along the z direction in the side surface 7a. The direction indicated by the arrow 34b is a direction in which the transmitting substrate 7 has flexibility in deformation. Thus, deformation of the bonding material 8 in the direction indicated by the arrow 34b further alleviates the tensile stress in the bonding material 8 in the θ direction.

Further, when the anode 1 according to the present invention is mounted to the X-ray generating tube 102, the target layer 9 is oriented toward an inside of the X-ray generating tube 102. The inside of the X-ray generating tube 102 is depressurized and an outside thereof is, as described below, in a state of being filled with an insulating fluid. Thus, the outside of the X-ray generating tube 102 is at a higher pressure than the inside of the X-ray generating tube 102. Therefore, due to a difference in pressure between the inside and the outside of the X-ray generating tube 102, a force in the direction of the arrow 34b illustrated in FIG. 3B acts on the transmitting substrate 7, and thus, a force that further compresses the bonding material 8 acts. As a result, the tensile stress in the bonding material 8 in the θ direction is further alleviated.

According to the present invention, it is preferred that action of alleviating the tensile stress, which acts on the bonding material 8 in the θ direction, act to an extent in the inside of the X-ray generating tube 102. Therefore, it is preferred that the thickness distribution of the bonding material 8 be formed so that the thickness reduces from the target layer 9 toward the transmitting substrate 7 in the z direction.

Figure 4:
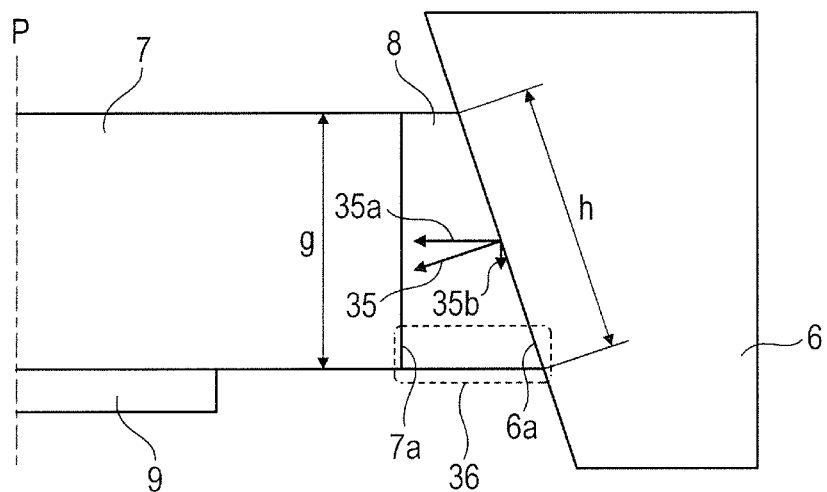
FIG. 4 is a sectional view for schematically illustrating a structure and an alleviating effect of the compression stress of an anode according to another embodiment of the present invention, and is a sectional view taken along the central axis of the tubular anode member.

The mode as in the embodiment illustrated in FIG. 1A to FIG. 3B, in which the thickness distribution of the bonding material 8 is set so that the thickness reduces from the target layer 9 toward the transmitting substrate 7 in the z direction, can also be implemented by slanting the inner circumferential surface 6a of the tubular anode member 6. FIG. 4 is a sectional view of such an embodiment of the present invention. Also in this case, similarly to the case illustrated in FIG. 1A to FIG. 3B, a region 36 in which the tensile stress in the θ direction is more alleviated is formed in the bonding material 8 on a larger thickness side thereof. Also in this case, contraction of the bonding material 8 causes a force indicated by an arrow 35 along a direction of the normal to the inner circumferential surface 6a to act on the inner circumferential surface 6a of the tubular anode member 6. The direction of the force can be divided into directions indicated by an arrow 35a and an arrow 35b. However, even when the force in the direction of the arrow 35b acts on the tubular anode member 6, the tubular anode member 6 does not move in a direction to compress the bonding material 8, and thus, the action of the transmitting substrate 7 to compress the bonding material 8 as illustrated in FIG. 3B cannot be obtained. Further, the side surface 7a of the transmitting substrate 7 is in parallel with the central axis P, and thus, the action of the transmitting substrate 7 to compress the bonding material 8 due to a difference in pressure between the inside and the outside of the X-ray generating tube 102 cannot be obtained either.

However, in the case illustrated in FIG. 4, an effect due to a difference in length of the bonding surface between the transmitting substrate 7 and the tubular anode member 6 is obtained. As illustrated in FIG. 4, in this case, on the virtual plane including the central axis P, a length g of the side surface 7a of the transmitting substrate 7 is smaller than a length h of the bonded region of the tubular anode member 6 with the bonding material 8. In a combination of ordinary materials of the transmitting substrate 7, the tubular anode member 6, and the bonding material 8, the coefficients of thermal expansion satisfy a relationship "transmitting substrate 7<tubular anode member 6<bonding material 8", and a difference in coefficient of thermal expansion in the bonded region of the tubular anode member 6 is smaller than a difference in coefficient of thermal expansion in the bonded region of the transmitting substrate 7. In the case illustrated in FIG. 4, the bonded region of the transmitting substrate 7 in which damage such as peeling of the bonding material 8 or development of a crack due to a difference in coefficient of thermal expansion is more likely to be observed is shorter than the bonded region of the tubular anode member 6, and thus, damage of the bonding material 8 is less likely to be observed compared to an opposite case.

According to the present invention, a combination of materials for obtaining the effect is diamond for the transmitting substrate 7, tungsten or copper for the tubular anode member 6, and a brazing material for the bonding material 8.

According to the present invention, from the viewpoint of enhancing reliability of the X-ray generating tube 102, it is preferred that the regions 33 and 36 in which the tensile stress in the bonding material 8 in the θ direction is more alleviated be formed at a position nearer to the inside of the X-ray generating tube 102. Therefore, it is preferred that the thickness of the bonding material 8 reduce in the direction along the central axis P of the tubular anode member 6 and in the direction from the target layer 9 toward the transmitting substrate 7.

Further, in this case, in view of manufacturing efficiency and an effect, a ratio tmax/tmin of a thickness tmax of a thickest portion to a thickness tmin of a thinnest portion of the bonding material 8 is preferably 1.05 to 1.90, and more preferably 1.20 to 1.70. In the mode illustrated in FIG. 1A to FIG. 3B, e and f illustrated in FIG. 2C are tmin and tmax, respectively.

Second Embodiment

Figure 5:
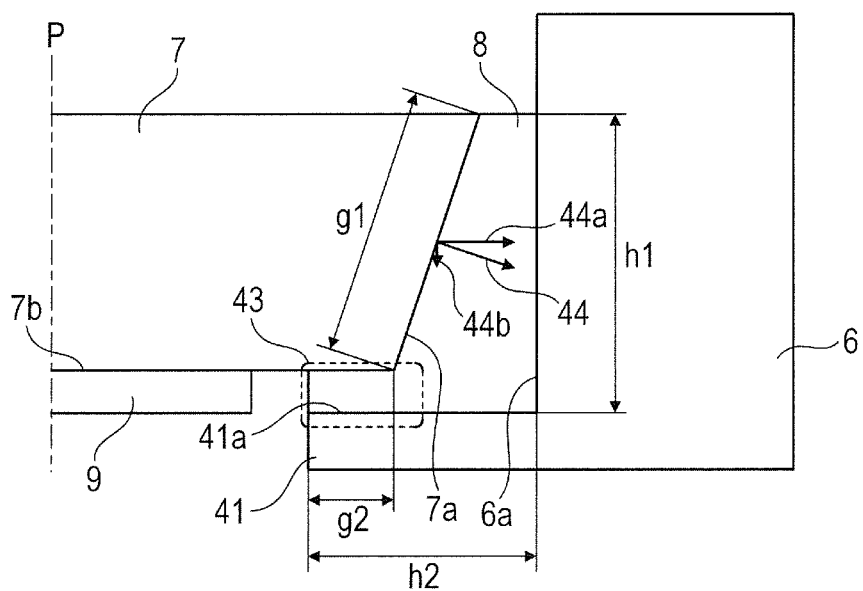
FIG. 5 is a sectional view for schematically illustrating a structure and an alleviating effect of the compression stress of an anode according to still another embodiment of the present invention, and is a sectional view taken along the central axis of the tubular anode member.

FIG. 5 is a partial sectional view for schematically illustrating a structure of an anode according to another exemplary embodiment of the present invention. In this embodiment, the transmitting substrate 7 has a support surface 7b for supporting the target layer 9. Further, the tubular anode member 6 has a tube inner circumference for supporting the transmitting substrate 7. Further, the tubular anode member 6 of this embodiment includes a ring-shaped protruding portion 41 that protrudes inward in a tube radial direction from the tube inner circumference, which is a point of the tubular anode member of this embodiment that is different from that of the first embodiment described with reference to FIG. 1A to FIG. 3B. The ring-shaped protruding portion 41 has a bearing surface 41a opposed to a periphery of the support surface 7b. The bonding material 8 extends from a gap in a tube axial direction that extends in the direction of the tube axis between the side surface 7a and the tube inner circumference 6a to a gap in a tube radial direction (region 43) that extends in the tube radial direction between the periphery of the support surface 7b and the bearing surface 41a. Note that, in this case, the tubular anode member 6 is cylindrical, and thus, an internal diameter of the ring-shaped protruding portion 41 is smaller than an internal diameter of the tube inner circumference.

As described with reference to FIG. 3A and FIG. 3B, the bonding material 8 in the process of contracting causes a force indicated by an arrow 44 along the direction of the normal to the side surface 7a to act on the slanted side surface 7a of the transmitting substrate 7, and a force indicated by an arrow 44b acts on the transmitting substrate 7. Note that, similarly to the case illustrated in FIG. 3B, the arrow 44 indicates a resultant force of a force component in a horizontal direction indicated by an arrow 44a and a force component in a vertical direction indicated by the arrow 44b. When the bonding material 8 is in the process of contracting, the transmitting substrate 7 is pressed to the target layer 9 side, and the periphery of the support surface 7b of the transmitting substrate 7 presses the bonding material 8 against the bearing surface 41a. Here, the bonding material 8 pressed by the periphery of the support surface 7b causes a compressive stress in accordance with the Poisson's ratio of the bonding material 8 to act in the θ direction, and hence the tensile stress caused in the θ direction is alleviated in the region 43.

Further, in the case illustrated in FIG. 5, the action of alleviating the tensile stress in the θ direction due to the difference in pressure between the inside and the outside of the X-ray generating tube 102 described with reference to FIG. 3B is also obtained. Further, similarly to the case illustrated in FIG. 4, when a length of the bonded region of the tubular anode member 6 (h1+h2) is larger than a length of the bonded region of the transmitting substrate 7 (g1+g2), and, when the coefficients of thermal expansion in the combination of the transmitting substrate 7, the tubular anode member 6, and the bonding material 8 satisfy the relationship of "transmitting substrate 7<tubular anode member 6<bonding material 8", damage of the bonding material 8 can be reduced.

In this example, the region 43 in which the tensile stress in the bonding material 8 in the θ direction is more alleviated is formed at a position nearer to the inside of the X-ray generating tube 102, and thus, the reliability of the X-ray generating tube 102 can be further enhanced.

Also in this case, in view of manufacturing efficiency and an effect, in the region in which the side surface 7a of the transmitting substrate 7 and the inner circumferential surface 6a of the tubular anode member 6 are opposed to each other, the ratio tmax/tmin of the thickness tmax of the thickest portion to the thickness tmin of the thinnest portion of the bonding material 8 is preferably 1.05 to 1.90, and more preferably 1.20 to 1.70.

In the first and second embodiments described above, the tubular anode member 6 is described as a cylindrical shape that has high continuity in the circumferential direction, but, the tubular anode member 6 according to the present invention is not limited to the cylindrical shape. A mode having an opening that is in the shape of a polygon in section (not shown) is also within the scope of the present invention. According to the present invention, when the tubular anode member is cylindrical, the effect of reducing the tensile stress by the thickness distribution of the bonding material along the tube axis direction can be produced over the entire circumferential direction, which is preferred.

<X-ray Generating Apparatus>

Figure 6:
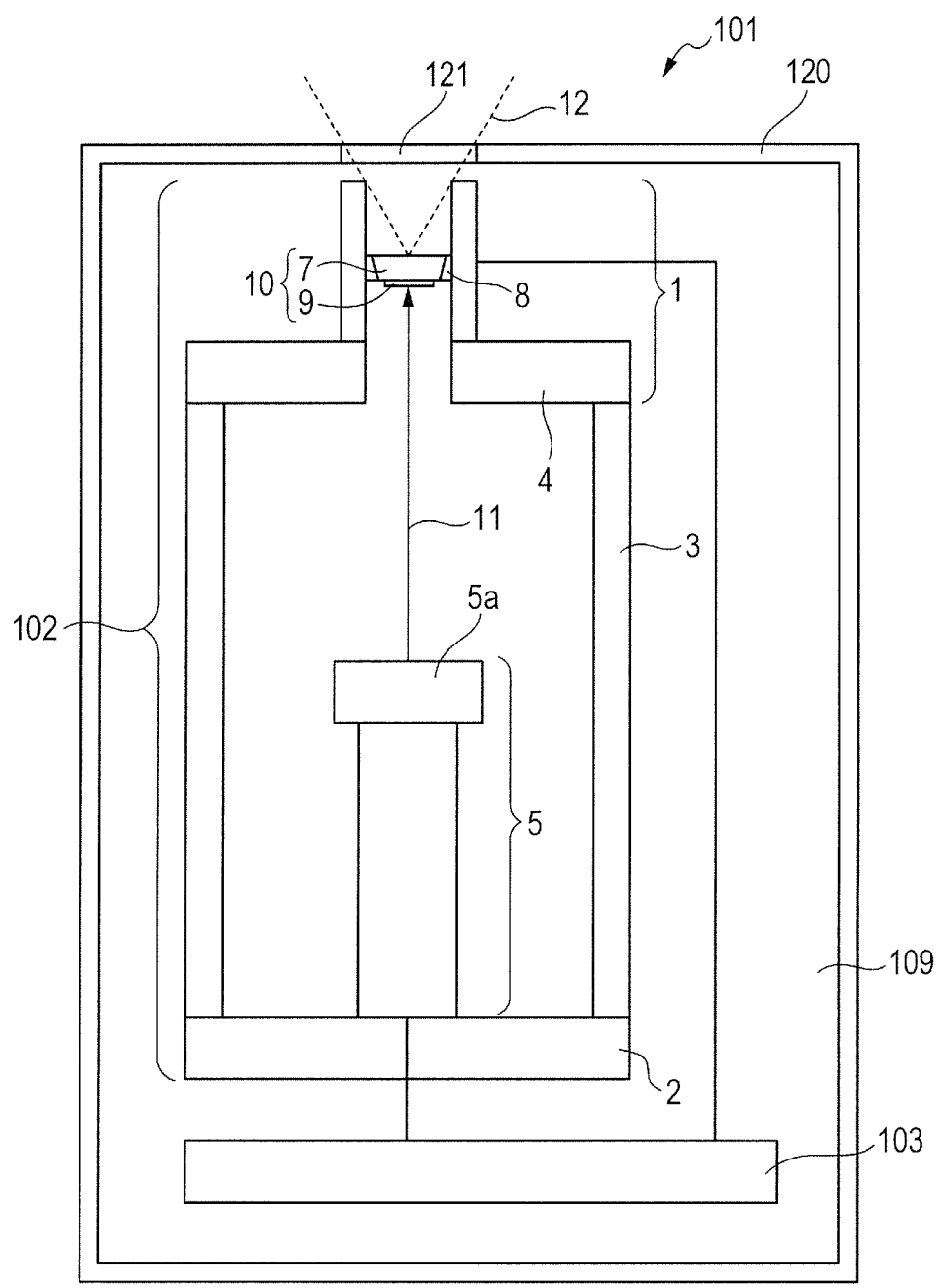
FIG. 6 is a sectional view for schematically illustrating a structure of an X-ray generating apparatus according to an embodiment of the present invention.

FIG. 6 is a schematic sectional view for illustrating a structure of an X-ray generating apparatus according to an embodiment of the present invention. An X-ray generating apparatus 101 according to the present invention has a feature of including the X-ray generating tube 102 using the anode 1 according to the present invention and a drive circuit 103 for applying a tube voltage to the cathode 2 and the anode 1 of the X-ray generating tube 102.

In this case, the X-ray generating apparatus 101 includes, in a container 120 with an X-ray transmission window 121, the X-ray generating tube 102 of the present invention as an X-ray source and the drive circuit 103 for outputting a tube voltage that is to be applied between the cathode 2 and the anode 1 of the X-ray generating tube 102.

It is desired that the container 120 for containing the X-ray generating tube 102 and the drive circuit 103 have a strength sufficient for a container and have excellent heat dissipation performance, and, as a material thereof, a metal material such as brass, iron, or a stainless steel is suitably used.

In this case, a space in the container 120 except a space necessary for arranging the X-ray generating tube 102 and the drive circuit 103 is filled with an insulating fluid 109. The insulating fluid 109, which may be a liquid or a gas, has electric insulating properties, and plays a role in maintaining electrical insulation in the container 120 and a role as a cooling medium of the X-ray generating tube 102. It is preferred that, when an insulating liquid is used, electrically insulating oil such as a mineral oil, a silicone oil, or a perfluoro oil be used.

<Radiography system>

Figure 7:
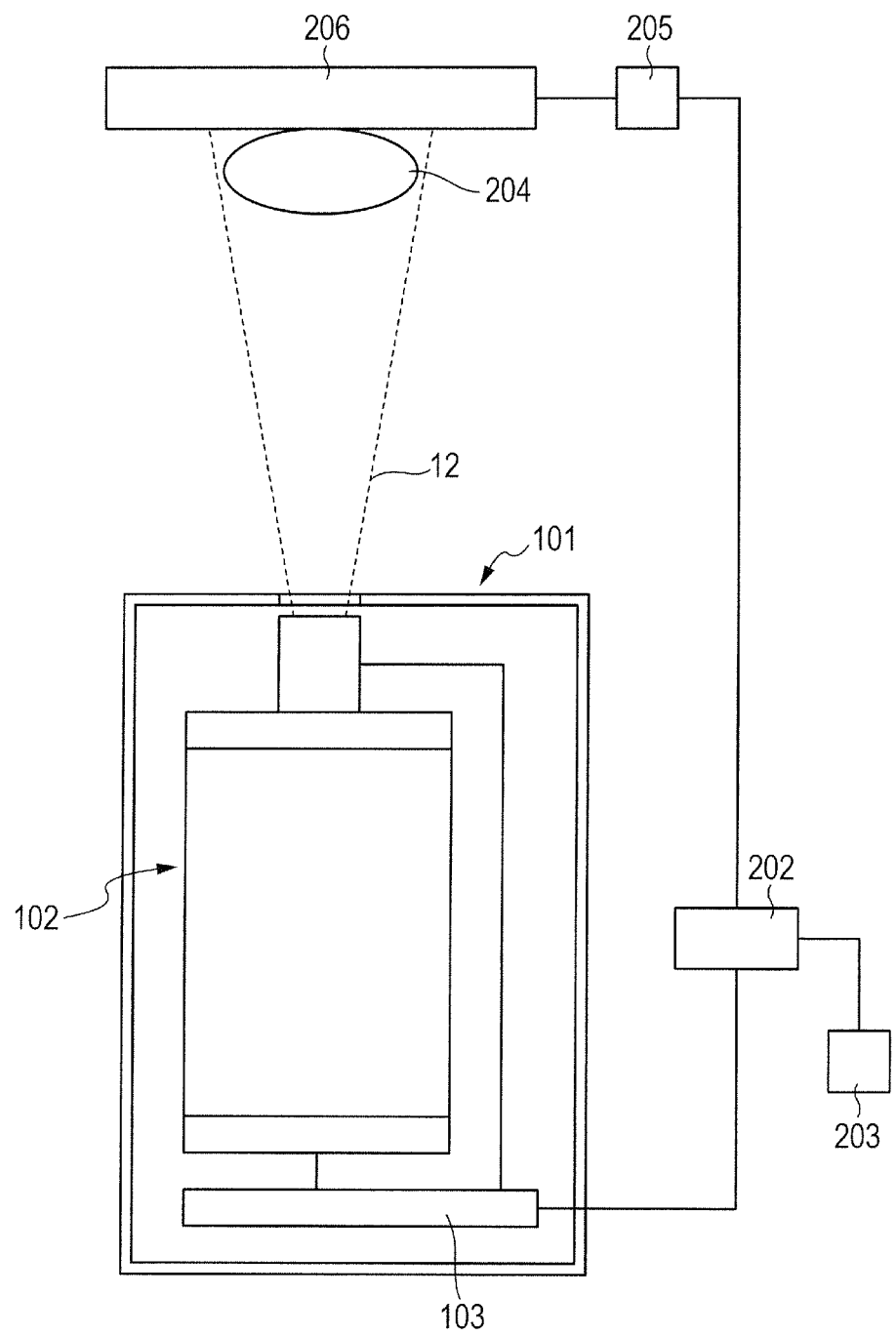
FIG. 7 is a block diagram for schematically illustrating a structure of a Radiography system according to an embodiment of the present invention.

FIG. 7 is a block diagram for schematically illustrating a structure of a Radiography system according to an embodiment of the present invention.

A system control device 202 controls the X-ray generating apparatus 101 and other related apparatus in a coordinated manner. The drive circuit 103 outputs various kinds of control signals to the X-ray generating tube 102 under the control of the system control device 202. A state of emission of the X-ray 12 emitted from the X-ray generating apparatus 101 is controlled by the control signals. The X-ray 12 emitted from the X-ray generating apparatus 101 passes through a subject 204, to thereby be detected by an X-ray detection device 206. The X-ray detection device 206 converts the detected X-ray 12 into image signals and outputs the image signals to a signal processing portion 205. Under the control of the system control device 202, the signal processing portion 205 applies predetermined signal processing to the image signals, and outputs the processed image signals to the system control device 202. Based on the processed image signals, the system control device 202 outputs display signals to a display device 203 for displaying an image on the display device 203. The display device 203 displays on a screen an image of the subject 204 based on the display signals.

REFERENCE SIGNS LIST

1: anode, 2: cathode, 3: insulating tube, 5: electron emission source, 5a: electron emitting source, 6: tubular anode member, 6a: inner circumferential surface of tubular anode member, 7: transmitting substrate, 7a: side surface of transmitting substrate, 7b: support surface of transmitting substrate, 8: bonding material, 9: target layer, 10: transmission target, 11: electron beam, 12: X-ray, 41: ring-shaped protruding portion, 41a: bearing surface, 101: X-ray generating apparatus, 102: X-ray generating tube, 103: drive circuit, 202: system control device, 204: subject, 206: X-ray detection device While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An anode for an X-ray generating tube comprising:
   a transmission target including:
      a target layer for generating an X-ray, and
      a transmitting substrate including a first surface configured to support the target layer, a second surface opposite to the first surface, and an annular lateral surface which is a side surface of the transmitting substrate between the first surface and the second surface; and
   a tubular anode member including an annular inner circumferential surface, the annular inner circumferential surface of the tubular anode member being bonded to the transmitting substrate via a bonding material extending from a periphery of the first surface toward a periphery of the second surface,
      wherein the bonding material has a thickness variation, the thickness decreasing from the first surface toward the second surface in an axial direction along a tube axis of the tubular anode member, and
      wherein the thickness of the bonding material is a width between the annular lateral surface and the annular inner circumferential surface of the tubular anode member.

2. The anode according to claim 1, wherein a cross-sectional area of the transmitting substrate orthogonal to the axial direction increases from the target layer toward the transmitting substrate in the axial direction.

3. The anode according to claim 1, wherein coefficients of thermal expansion of the transmitting substrate, the tubular anode member, and the bonding material satisfy a relationship of transmitting substrate<tubular anode member<bonding material.

4. The anode according to claim 1, wherein the bonding material comprises a brazing material.

5. The anode according to claim 1, wherein the transmitting substrate comprises diamond.

6. The anode according to claim 1, wherein the tubular anode member comprises at least any one of tungsten, silver, molybdenum, tantalum, and copper.

7. The anode according to claim 1, wherein a ratio (tmax/tmin) of a thickness (tmax) of a thickest portion of the bonding material to a thickness (tmin) of a thinnest portion of the bonding material is in a range of 1.05 to 1.90.

8. The anode according to claim 7, wherein a ratio (tmax/tmin) of a thickness (tmax) of the thickest portion of the bonding material to the thickness (tmin) of the thinnest portion of the bonding material is in a range of 1.2 to 1.7.

9. The anode according to claim 1; wherein the tubular anode member is cylindrical and the transmitting substrate is in a shape of a disk.

10. An X-ray generating tube comprising:
an anode according to claim 1;
a cathode including an electron source configured to emit an electron beam toward the target layer; and
an insulating tube secured to each one of the anode and the cathode.

11. An X-ray generating apparatus comprising:
the X-ray generating tube according to claim 10; and
a drive circuit configured to apply a tube voltage between the cathode and the anode.

12. A radiography system comprising:
the X-ray generating apparatus according to claim 11;
an X-ray detection device configured to detect an X-ray generated from the X-ray generating apparatus and passes through a subject; and
a system control device for integrally controlling the X-ray generating apparatus and the X-ray detection device.

13. An anode for an X-ray generating tube comprising:
a transmission target including:
a target layer for generating an X-ray, and
a transmitting substrate including a first surface configured to support the target layer, a second surface opposite to the first surface, and an annular lateral surface which is a side surface of the transmitting substrate between the first surface and the second surface; and
a tubular anode member including an annular inner circumferential surface, the annular inner circumferential surface of the tubular anode member being bonded to the transmitting substrate via a bonding material extending from a periphery of the first surface toward a periphery of the second surface,
wherein the bonding material has a sectional shape sufficient to generate compressive stress in the axial direction along a tube axis of the tubular anode member and alleviate a circumferential tensile stress of the bonding material.

14. An X-ray generating tube comprising:
an insulating tube,
a cathode mounted on one end of the insulating tube,
an anode mounted on another end of the insulating tube, and
an electron emission source arranged in the insulating tube and connected to the cathode,
wherein the anode comprises the anode according to claim 13.

15. An X-ray generating apparatus comprising:
the X-ray generating tube according to claim 14; and
a drive circuit for applying a tube voltage to the cathode and the anode of the X-ray generating tube.

16. A radiography system comprising:
the X-ray generating apparatus according to claim 15;
an X-ray detection device for detecting an X-ray that is emitted from the X-ray generating apparatus and passes through a subject; and
a system control device for integrally controlling the X-ray generating apparatus and the X-ray detection device.

17. The anode according to claim 1; wherein the bonding material extends along the annular inner circumferential surface of the tubular anode member and does not extend beyond any boundary between a couple of adjacent regions of the tubular anode member; both of which regions have different coefficients of thermal expansion for each other.

18. The anode according to claim 13; wherein the bonding material extends along the annular inner circumferential surface of the tubular anode member and does not extend beyond any boundary between a couple of adjacent regions of the tubular anode member; both of which regions have different coefficients of thermal expansion for each other.

19. The anode according to claim 1, wherein the tubular anode member has a uniform coefficient of thermal expansion where the annular inner circumferential surface is bonded to the bonding material.

20. The anode according to claim 13, wherein the tubular anode member has a uniform coefficient of thermal expansion where the annular inner circumferential surface is bonded to the bonding material.

21. The anode according to claim 13, wherein the bonding material has a thickness variation, the thickness decreasing from the first surface toward the second surface in an axial direction along a tube axis of the tubular anode member.

22. The anode according to claim 13, wherein the bonding material has a thickness variation, the thickness decreasing from the second surface toward the first surface in an axial direction along a tube axis of the tubular anode member.

23. An X-ray generating tube comprising:
an anode according to claim 13,
a cathode including an electron emission source configured to emit an electron beam toward the target layer, and
an insulating tube secured to each one of the anode and the cathode.

24. An X-ray generating apparatus comprising:
the X-ray generating tube according to claim 23; and
a drive circuit for applying a tube voltage to the cathode and the anode of the X-ray generating tube.

25. A radiography system comprising:
the X-ray generating apparatus according to claim 24;
an X-ray detection device for detecting an X-ray that is emitted from the X-ray generating apparatus and passes through a subject; and
a system control device for integrally controlling the X-ray generating apparatus and the X-ray detection device.

26. An anode for an X-ray generating tube comprising:
a transmission target including:
a target layer for generating an X-ray; and
a transmitting substrate including a first surface configured to support the target layer; a second surface opposite to the first surface; and an annular lateral surface which is a side surface next to each one of the first surface and the second surface;

a bonding material extending circumferentially around the annular lateral surface; and a tubular anode member including an inner circumferential surface to be bonded to the annular lateral surface via the bonding material;

wherein the bonding material has a thickness variation such that a thickness of the bonding material in a radial direction of the tubular anode member decreases from any one of a first surface side and a second surface side toward the other of the first surface side and the second surface side in an axial direction of the tubular anode member.

27. The anode according to claim 26, wherein a coefficient of thermal expansion of the bonding material is higher than each one of those of the transmitting substrate and the tubular anode member.

28. The anode according to claim 26, wherein the tubular anode member includes an inwardly protruding portion.

29. The anode according to claim 26, wherein the bonding material includes an extending portion located between a periphery of the first surface and an inwardly protruding portion.

30. The anode according to claim 26, wherein the first surface side is in association with a region closer to the first surface than the second surface between the annular lateral surface and the inner circumferential surface, and the second surface side is in association with a region closer to the second surface than the first surface between the annular lateral surface and the inner circumferential surface.

31. An anode for an X-ray generating tube comprising:
a transmission target including:
a target layer for generating an X-ray, and
a transmitting substrate including a first surface configured to support the target layer, a second surface opposite to the first surface, and an annular lateral surface which is a side surface next to each one of the first surface and the second surface;

a bonding material extending circumferentially around the annular lateral surface; and a tubular anode member including an inner circumferential surface to be bonded to the annular lateral surface via the bonding material, wherein the bonding material has a sectional shape sufficient to generate compressive stress in an axial direction of the tubular anode member and alleviate a circumferential tensile stress of the bonding material.

\* \* \* \* \*